(12) United States Patent
Kinsman

(10) Patent No.: US 7,385,298 B2
(45) Date of Patent: *Jun. 10, 2008

(54) REDUCED-DIMENSION MICROELECTRONIC COMPONENT ASSEMBLIES WITH WIRE BONDS AND METHODS OF MAKING SAME

(75) Inventor: Larry D. Kinsman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/495,160

(22) Filed: Jul. 27, 2006

(65) Prior Publication Data

US 2007/0029681 A1    Feb. 8, 2007

Related U.S. Application Data

(63) Continuation of application No. 10/932,840, filed on Sep. 1, 2004, now Pat. No. 7,095,122.

(51) Int. Cl.
*H01L 23/48* (2006.01)

(52) U.S. Cl. ............... 257/784; 257/E23.183; 257/692; 257/730; 257/786; 257/E23.068

(58) Field of Classification Search ........... 257/784, 257/E23.183

See application file for complete search history.

(56) References Cited

U.S. PATENT DOCUMENTS

| | | | |
|---|---|---|---|
| 4,751,172 A * | 6/1988 | Rodriguez et al. | 204/478 |
| 5,062,565 A | 11/1991 | Wood et al. | |
| 5,128,831 A | 7/1992 | Fox, III et al. | |
| 5,145,099 A | 9/1992 | Wood et al. | |
| 5,593,927 A | 1/1997 | Farnworth et al. | |
| 5,677,566 A | 10/1997 | King et al. | |
| 5,826,628 A | 10/1998 | Hamilton | |
| 5,891,797 A | 4/1999 | Farrar | |
| 5,946,553 A | 8/1999 | Wood et al. | |
| 5,986,209 A | 11/1999 | Tandy | |
| 5,990,566 A | 11/1999 | Farnworth et al. | |
| RE36,469 E | 12/1999 | Wood et al. | |
| 6,018,249 A | 1/2000 | Akram et al. | |
| 6,020,624 A | 2/2000 | Wood et al. | |
| 6,025,728 A | 2/2000 | Hembree et al. | |
| 6,072,233 A | 6/2000 | Corisis et al. | |
| 6,089,920 A | 7/2000 | Farnworth et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,130,474 A | 10/2000 | Corisis | |
| 6,133,622 A | 10/2000 | Corisis et al. | |
| 6,148,509 A | 11/2000 | Schoenfeld et al. | |
| 6,150,710 A | 11/2000 | Corisis | |
| 6,150,717 A | 11/2000 | Wood et al. | |

(Continued)

*Primary Examiner*—Tu-Tu V Ho
(74) *Attorney, Agent, or Firm*—Perkins Coie LLP

(57) ABSTRACT

The present disclosure suggests various microelectronic component assembly designs and methods for manufacturing microelectronic component assemblies. In one particular implementation, a microelectronic component assembly includes a microelectronic component mounted to a substrate. The substrate carries a plurality of bond pads at a location substantially coplanar with a terminal surface of the microelectronic component. This enables a smaller package to be produced by moving the bond pads laterally inwardly toward the periphery of the microelectronic component.

18 Claims, 4 Drawing Sheets

U.S. PATENT DOCUMENTS

| | | |
|---|---|---|
| 6,153,924 A | 11/2000 | Kinsman |
| 6,159,764 A | 12/2000 | Kinsman et al. |
| 6,165,887 A | 12/2000 | Ball |
| 6,188,232 B1 | 2/2001 | Akram et al. |
| 6,201,304 B1 | 3/2001 | Moden |
| 6,214,716 B1 | 4/2001 | Akram |
| 6,225,689 B1 | 5/2001 | Moden et al. |
| 6,228,548 B1 | 5/2001 | King et al. |
| 6,229,202 B1 | 5/2001 | Corisis |
| 6,232,666 B1 | 5/2001 | Corisis et al. |
| 6,239,489 B1 | 5/2001 | Jiang |
| 6,246,108 B1 | 6/2001 | Corisis et al. |
| 6,247,629 B1 | 6/2001 | Jacobson et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,766 B1 | 7/2001 | Moden |
| 6,271,580 B1 | 8/2001 | Corisis |
| 6,281,042 B1 | 8/2001 | Ahn et al. |
| 6,285,204 B1 | 9/2001 | Farnworth |
| 6,291,894 B1 | 9/2001 | Farnworth et al. |
| 6,326,698 B1 | 12/2001 | Akram |
| 6,329,222 B1 | 12/2001 | Corisis et al. |
| 6,331,221 B1 | 12/2001 | Cobbley |
| 6,344,976 B1 | 2/2002 | Schoenfeld et al. |
| 6,437,586 B1 | 8/2002 | Robinson |
| 6,483,044 B1 | 11/2002 | Ahmad |
| 6,506,979 B1 * | 1/2003 | Shelnut et al. .............. 174/255 |
| 6,614,092 B2 | 9/2003 | Eldridge et al. |
| 6,650,013 B2 | 11/2003 | Yin et al. |
| 6,677,219 B2 | 1/2004 | Hasegawa et al. |
| 6,768,212 B2 | 7/2004 | Karashima et al. |
| 7,092,122 B2 | 8/2006 | Iwaki |
| 2004/0155332 A1 | 8/2004 | Petty-Weeks et al. |

* cited by examiner

REDUCED-DIMENSION MICROELECTRONIC COMPONENT ASSEMBLIES WITH WIRE BONDS AND METHODS OF MAKING SAME

CROSS-REFERENCE TO RELATED APPLICATION

This application is a continuation of U.S. patent application Ser. No. 10/932,840 filed Sep. 1, 2004, now U.S. Pat. No. 7,095,122 issued Aug. 22, 2006, which is incorporated herein by reference in its entirety.

TECHNICAL FIELD

The present invention relates to microelectronic component assemblies and methods of manufacturing microelectronic component assemblies. In particular, aspects of the invention relate to microelectronic component assemblies that include wire bonds. Certain embodiments of the invention are advantageous for packaged microelectronic component assemblies.

BACKGROUND

Semiconductor chips or dies typically are manufactured from a semiconductor material such as silicon, germanium, or gallium/arsenide. An integrated circuit or other active feature(s) is incorporated in the die adjacent one surface, often referred to as the "active surface," of the die. The active surface typically also includes input and output terminals to facilitate electrical connection of the die with another microelectronic component.

Since semiconductor dies can be degraded by exposure to moisture and other chemical attack, most dies are encapsulated in a package that protects the dies from the surrounding environment. The packages typically include leads or other connection points that allow the encapsulated die to be electrically coupled to another electronic component, e.g., a printed circuit board. One common package design includes a semiconductor die attached to a small circuit board, e.g., via a die attach adhesive. Some or all of the terminals of the semiconductor die then may be connected electrically to a first set of contacts of the board, e.g., by wire bonding. The connected board and die may then be encapsulated in a mold compound to complete the packaged microelectronic component assembly. A second set of contacts carried on an outer surface of the board remain exposed; these exposed contacts are electrically connected to the first contacts, allowing the features of the semiconductor die to be electrically accessed.

FIG. 1 schematically illustrates a conventional packaged microelectronic component assembly 10. This microelectronic component assembly 10 includes a semiconductor die 20 having a front surface 22, which bears an array of terminals 24, and a back surface 26. This semiconductor die 20 is mounted to a front side 42 of a circuit board 40, e.g., by attaching the back surface 26 of the die 20 to the circuit board front side 42 with a die attach paste 35.

The microelectronic component assembly 10 also includes a plurality of bond wires 50 that extend from individual terminals 24 of the die 20 to bond pads 44 arranged on the front side 42 of the board 40. Typically, these bond wires 50 are attached using wire-bonding machines that spool a length of wire through a capillary. As suggested in FIG. 1, these capillaries C feed a length of wire 50 through a narrow distal passage. Typically, a molten ball is formed at a protruding end of the wire 50 and the capillary C pushes this molten ball against one of the bond pads 44, thereby attaching the terminal end of the wire 50 to the board 40, as shown. Thereafter, the capillary C spools out a length of the wire 50, presses the wire against one of the terminals 24 on the die 20, and bonds the wire to the terminal 24, e.g., by ultrasonic or thermosonic welding.

The capillaries C commonly used in the field have precisely shaped ends to insure good bonding of the wire to the bond pads 44 of circuit boards 40 and the terminals 24 of dies 20. Most capillaries C also taper outwardly moving away from this tip. As shown in FIG. 1, the capillary C will thus have an appreciable width W that must fit between the bond wire 50 in the capillary C and the top corner of the die 20. This width W will depend, in part, on the height H of the front surface 22 of the die 20 from the front side 42 of the circuit board 40. For one common type of semiconductor die, the height H is usually on the order of 100 µm. In such circumstances, the distance D between the edge of the die 20 and the bond pad 44 is over 0.2 mm, typically 0.5 mm or more, to accommodate the width W of the capillary C without unduly risking damage to the die 20. Conventional designs such as those shown in FIG. 1 often include bond pads 44 on opposing sides of the die 20. Hence, the same space D must be provided on both sides of the die 20, adding an additional 0.4 millimeters or more, typically at least 1 millimeter, to the lateral dimension of the final diced and packaged microelectronic component.

Market pressures to reduce the size of electronic devices, e.g., mobile telephones and hand-held computing devices, place a premium on the space or "real estate" available for mounting microelectronic components on a printed circuit board or the like. Similar density pressures also impact manufacturers of computers and other larger-scale electronic devices. An extra half of a millimeter per package 10, for example, can significantly add to the dimensions of an array of packaged memory chips, for example.

DETAILED DESCRIPTION

A. Overview

Figure 1:
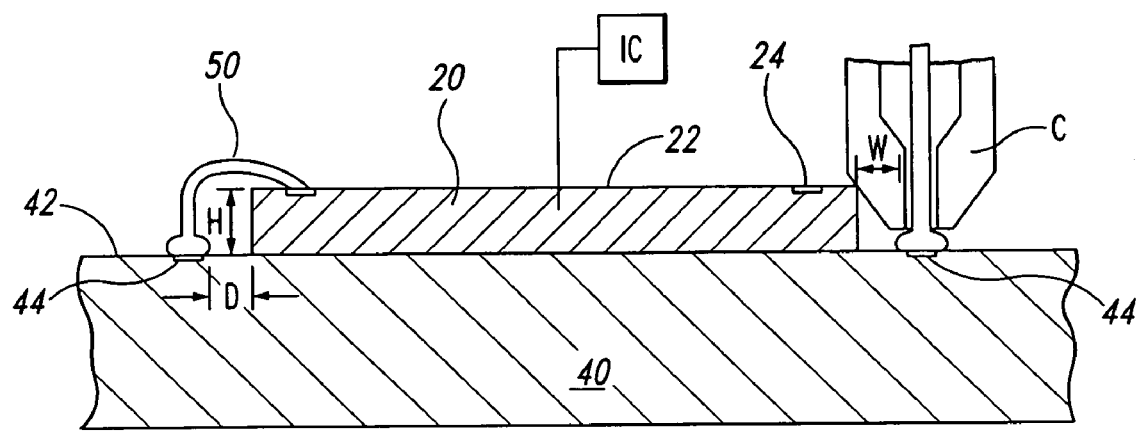
FIG. 1 is a schematic cross-sectional view of a conventional packaged microelectronic component assembly at one stage of manufacture.

Various embodiments of the present invention provide various microelectronic component assemblies and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

One embodiment provides a microelectronic component assembly that includes a microelectronic component substrate having a mounting surface. The microelectronic component is mounted to the mounting surface. The microelectronic component has a terminal surface spaced outwardly from the mounting surface, first and second terminals carried adjacent the terminal surface, and a periphery including first and second sides. A first support is carried by the substrate adjacent the first side of the microelectronic component periphery and a second support is carried by the substrate adjacent the second side of the microelectronic component periphery. The second support is spaced from the first support. A first bond pad surface is supported by the first support outwardly from the mounting surface and proximate the microelectronic component terminal surface. A second bond pad surface is supported by the second support outwardly from the mounting surface proximate the microelectronic component terminal surface. A first bond wire electrically couples the first terminal to the first bond pad surface and a second bond wire electrically couples the second terminal to the second bond pad surface. In select embodiments, the first support is spaced less than 0.2 millimeters, e.g., 0.05 millimeters or less, from the first side of the microelectronic component periphery.

Another embodiment of the invention provides a microelectronic component substrate that includes a body, a first support, and a second support. The body carries a circuit and has a front surface. A portion of the front surface defines a microelectronic component mounting surface having a periphery and sized to support a microelectronic component. The first support is carried by the body proximate a first side of the mounting surface periphery. The first support supports a first bond pad surface at a position spaced outwardly from the mounting surface. The first bond pad surface is electrically coupled to the circuit of the body. The second support is carried by the body at a location spaced from the first contact support and proximate a second side of the mounting surface periphery. The second contact support supports a second bond pad surface at a position spaced outwardly from the mounting surface. The second bond pad surface is electrically coupled to the circuit of the body.

A method of assembling a microelectronic component assembly in accordance with still another embodiment of the invention involves juxtaposing a confronting surface of a microelectronic component with a mounting surface of a substrate, wherein the microelectronic component is positioned between a first support carried by the substrate and a second support carried by the substrate. The confronting surface of the microelectronic component is attached to the mounting surface of the substrate, thus positioning a terminal surface of the microelectronic component outwardly from the mounting surface. A first bond wire is attached to a first terminal that is carried by the microelectronic component adjacent its terminal surface and to a first bond pad surface carried by the first support at a location proximate a plane of the terminal surface. A second bond wire is attached to a second terminal that is carried by the microelectronic component adjacent its terminal surface and to a second bond pad surface carried by the second support at a location proximate the plane of the terminal surface.

For ease of understanding, the following discussion is subdivided into two areas of emphasis. The first section discusses microelectronic component assemblies in accordance with selected embodiments of the invention. The second section outlines methods in accordance with other embodiments of the invention.

B. Microelectronic Component Assemblies Having Elevated Wire Bond Pads

FIGS. 2-8 schematically illustrate microelectronic component assemblies in accordance with selected embodiments of the invention. These microelectronic component assemblies also may be referred to herein as subassemblies, primarily because they are unlikely to be sold commercially in this state and instead represent an intermediate stage in the manufacture of a commercial device, e.g., the packaged microelectronic component assembly 105 of FIG. 9.

Figure 2:
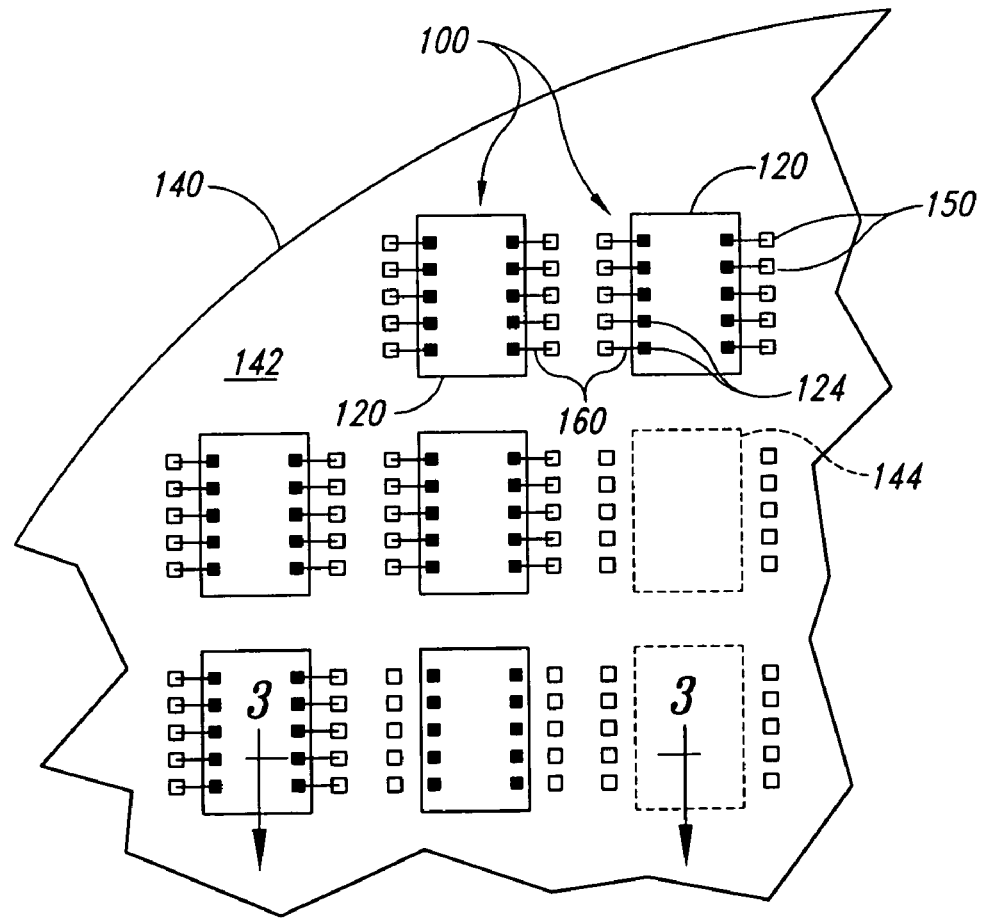
FIG. 2 is a schematic top view of a substrate including a plurality of microelectronic component assemblies in accordance with one embodiment of the invention.
Figure 3:
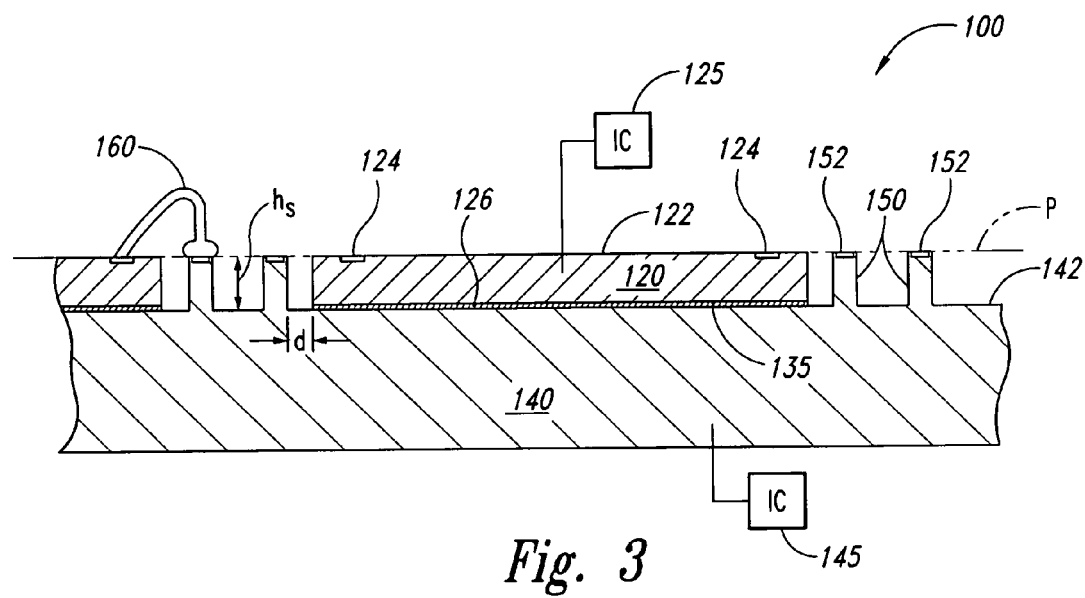
FIG. 3 is a schematic cross-sectional view of one of the microelectronic component assemblies of FIG. 2 taken along line 3-3 in FIG. 2.
Figure 4:
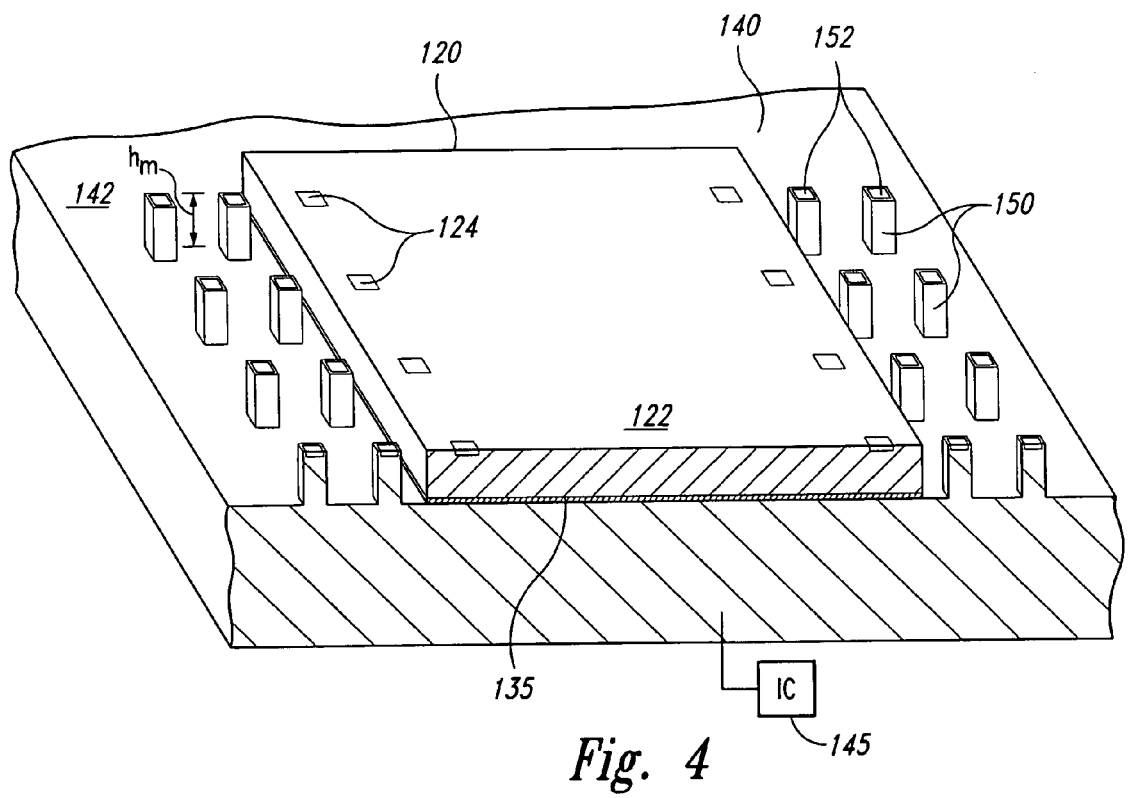
FIG. 4 is a schematic isolation perspective view of a portion of FIG. 3.

FIGS. 2-4 show a microelectronic component subassembly 100 that includes a microelectronic component 120 and a substrate 140. The microelectronic component 120 has a terminal surface 122 and a back surface 126. The terminal surface 122 carries an array of terminals 124 that are electrically connected to an integrated circuit 125. In the illustrated embodiment, the terminals 124 are arranged to extend along opposed, longitudinally extending sides of the microelectronic component 120. The terminals need not be so arranged, though. For example, the terminals 124 may be aligned along or adjacent a longitudinal midline of the microelectronic component 120.

The microelectronic component 120 may comprise a single microelectronic component or a subassembly of separate microelectronic components. In the embodiment shown in FIGS. 2-4, the microelectronic component 120 is typified as a single semiconductor die that includes an integrated circuit 125 (shown schematically in FIGS. 3 and 4). In one particular implementation, the microelectronic component 120 comprises a memory element, e.g., SIMM, DRAM, or flash memory. In other implementations, the microelectronic component 120 may comprise an ASIC or a processor, for example.

The substrate 140 may include circuitry 145 (shown schematically in FIGS. 3 and 4) and a front surface 142 that carries one or more microelectronic components 120. In the illustrated embodiment, a plurality of microelectronic components 120 are mounted in an array on the substrate 140. The substrate front surface 142 includes a microelectronic component mounting surface 144 for each microelectronic component 120. This mounting surface 144 is sized to closely receive a microelectronic component and may be thought of as having a periphery (shown in dashed lines in FIG. 2) with dimensions close to the dimensions of the microelectronic component 120 mounted thereon.

The substrate 140 also includes a plurality of supports 150 that extend outwardly from adjacent areas of the front surface 142 of the substrate 140. As shown in FIG. 3, these supports 150 may have a height $h_s$ outwardly from the substrate mounting surface 144 that is about the same as the height $h_m$ of the terminal surface 122 of the microelectronic component 120 from the mounting surface 144. This second height $h_m$ may include the thickness of both the microelectronic component 120 and the adhesive 135 used to attach the microelectronic component 120 to the mounting surface 144. In one embodiment, the height $h_s$ of each support 150 is approximately the same as the height $h_m$ of the adjacent microelectronic component terminal surface 122, both measured outwardly from the mounting surface 144. As a consequence, the upper ends of each of the supports 150 may generally coincide with the plane P (FIG. 3) of the adjacent component terminal surface 122.

In the embodiment of FIGS. 2-4, each of the supports 150 comprises a pillar that carries adjacent its outward end a bond pad 152 having a bond pad surface. These pillars 150 are typified in the drawings as rectilinear, e.g., substantially square, in cross-section, but any suitable cross-sectional shape could be used instead. As shown schematically in FIG. 4, the bond pads 152 carried by the supports 150 may be electrically coupled to the circuit 145 of the substrate 140. In one embodiment, the bond pads are formed using conventional wafer-level metal patterning techniques such as those used to create integrated circuits and electrical terminals of semiconductor dies.

The supports 150 may be positioned proximate the component mounting surface 144 of the substrate 140 in an array. The arrangement of the supports 150 within the array will depend on the locations of the terminals 124 of the microelectronic components 120. In the embodiments shown in FIGS. 2-4, the terminals 124 may be positioned in a pair of rows that extend longitudinally adjacent opposite sides of the microelectronic component periphery. The supports 150 are similarly arranged in a pair of generally parallel, spaced-apart rows. One of these rows may extend longitudinally adjacent one side of the microelectronic component 120 and the other row of supports 150 may extend longitudinally along an opposite side of the microelectronic component 120. As a consequence, each microelectronic component 120 is positioned between parallel rows of pillars associated with that component's mounting surface 144.

The supports 150 are spaced a distance d from the adjacent side of the microelectronic component periphery. As explained above, the distance D between the circuit board contacts 44 and the die terminals 24 in conventional microelectronic component assemblies 10 is at least 0.2 mm, typically 0.5 mm or greater. This distance D is necessary to accommodate the width W of the tip of the capillary C used to form the wire bond. Given the vertical proximity of the bond pad 152 and the component terminal surface 122 in the design of FIGS. 2-4, the distance d need not be large enough to accommodate the width W of the outwardly tapering portion of the capillary C. Hence, the distance d between the supports 150 and the adjacent side of the microelectronic component 120 can be less than that typically achievable in the conventional design of FIG. 1. In one embodiment, the distance d in FIGS. 3 and 4 is less than 0.2 mm, e.g., about 0.05 mm or less.

The conventional design of FIG. 1 employing a distance D of about 0.2 mm will add about 0.4 mm to the overall lateral dimension of the microelectronic component assembly 10 from the outer edge of one circuit board contact 44 to the outer edge of a contact 44 on the other side of the die 20. Embodiments of the invention may reduce this additional lateral width below 0.4 mm. For example, a distance d of about 0.05 mm or less will reduce the width of the microelectronic component assembly 100 by at least about 0.3 mm when compared to the design of FIG. 1. For example, two times a distance D in FIG. 1 of about 0.2 mm is 0.4 mm, whereas two times a distance d in FIGS. 3 and 4 of about 0.05 mm is only about 0.1 mm. Saving 0.3 mm in the width of each microelectronic component can save valuable real estate in electronic devices. If a semiconductor wafer is used as the substrate, this may also allow more microelectronic component assemblies to be produced using a single wafer.

Any of a variety of common microelectronic component substrate materials may be used to form the substrate 140. For example, the substrate may comprise a semiconductor device. In FIG. 2, the substrate 140 is typified as a semiconductor wafer having a plurality of microelectronic component mounting surfaces 144 arranged in an array, as noted above. In this embodiment, the supports 150 may be formed using photolithographic and etching techniques conventional in semiconductor wafer processing, for example. Briefly, this could involve depositing a photosensitive mask, selectively illuminating the mask, and selectively etching the mask to leave an area of the mask on each of the bond pads 152. A conventional chemical or plasma etch, e.g., an anisotropic chemical etch, may be used to remove material from the exposed areas of the substrate until the supports 150 have the desired height $h_m$ (FIG. 4). Thereafter, the photomask may be removed, leaving the illustrated structure.

In other embodiments, the substrate 140 may be flexible or rigid and have any desired configuration. For example, the substrate 140 may be formed of materials commonly used in microelectronic substrates such as ceramic, silicon, glass, or combinations thereof. Alternatively, the substrate 140 may be formed from an organic material. For example, the substrate 140 may have a laminate structure such as that found in BT resin, FR-4, FR-5, ceramic, and polyimide printed circuit boards. In one embodiment, the substrate 140 may be formed of a first ply or set of plies that define a first thickness t (FIG. 3) and a second ply or set of plies that have a thickness equal to the height $h_s$ of the support pillars 150.

The substrate 140 may be attached to the microelectronic component 120 by means of an adhesive 135. In the microelectronic component assembly 100 of FIGS. 3 and 4, the back surface 126 of the microelectronic component 120 is attached to the mounting surface 144 of the substrate 140 with a conventional die attach paste, as the adhesive 135. Die attach pastes are commercially available from a variety of sources and often comprise a thermoplastic resin or a curable epoxy. In other embodiments, the adhesive 135 may comprise a die attach tape, e.g., a polyimide film such as KAPTON, or any other suitable adhesive.

As illustrated in FIGS. 2 and 3, bond wires 160 may be used to electrically couple the terminals 124 of the microelectronic components 120 with the bond pads 152 of the adjacent supports 150. FIGS. 2 and 3 illustrate the microelectronic component assembly 100 at a stage of manufacture in which some of the bond wires 160 have been attached, but additional bond wires would be attached when the microelectronic component assembly 100 is completed. For example, the terminals 124 of the microelectronic component 120 in FIG. 3 can be connected to the adjacent bond pads 152 by additional bond wires (not shown).

Figure 5:
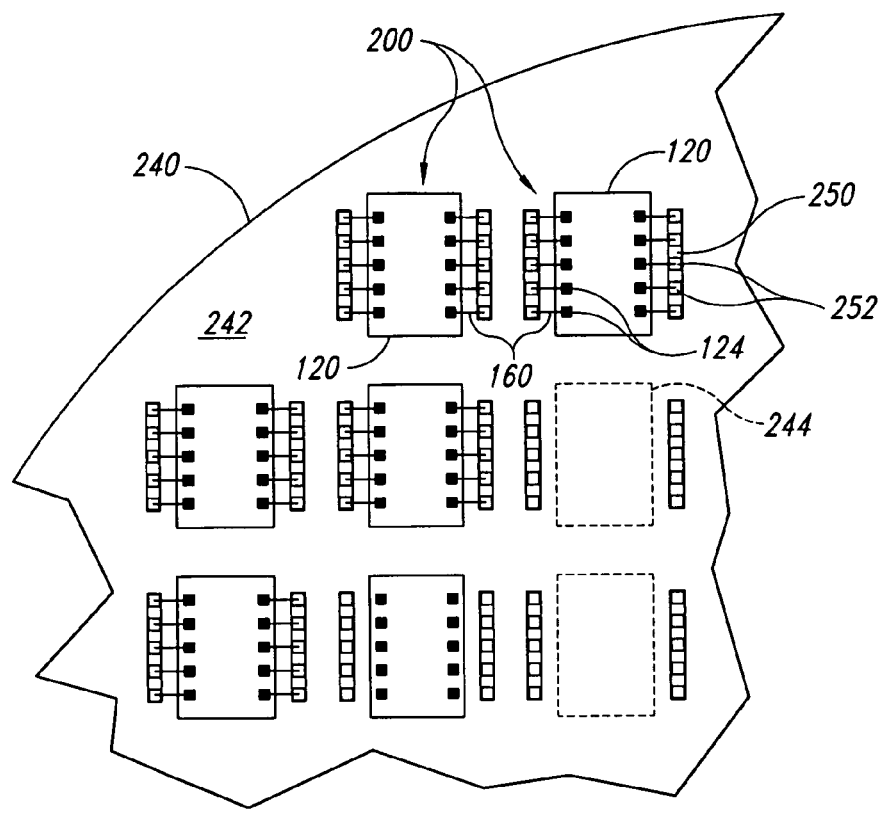
FIG. 5 is a schematic top view of a substrate including a plurality of microelectronic component assemblies in accordance with another embodiment of the invention.
Figure 6:
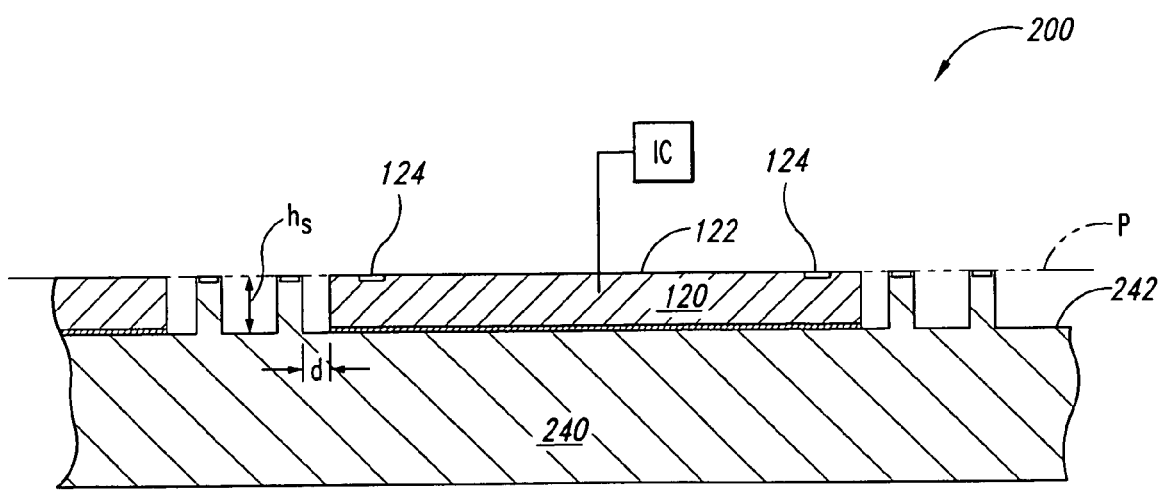
FIG. 6 is a schematic cross-sectional view of one of the microelectronic component assemblies of FIG. 5 taken along line 6-6 in FIG. 5.

FIGS. 5 and 6 schematically illustrate a microelectronic component assembly 200 in accordance with an alternative embodiment of the invention. Some elements of this design may be analogous to elements in the embodiment of FIGS. 2-4 and like reference numbers are used in both drawings to indicate analogous structures.

The microelectronic component assembly 200 of FIGS. 5 and 6 comprises a substrate 240 having a front surface 242 that includes a plurality of microelectronic component mounting surfaces 244 arranged in an array. Each of the mounting surfaces 244 may be sized to receive a microelectronic component 120, which may be substantially the same as the microelectronic component 120 of FIGS. 2-4.

One difference between the microelectronic component assembly 200 of FIGS. 5 and 6 and the microelectronic component assembly 100 of FIGS. 2-4 lies in the nature of the supports. In FIGS. 2-4, the supports 150 comprise a series of individual pillars, each of which may support as few as one bond pad 152. In the design of FIGS. 5 and 6, however, each of the supports 250 is sized to support two or more bond pads 252. Each support 250 comprises an elongate member that extends along a length of a side of the periphery of the microelectronic component 120. For each microelectronic component 120 and its associated mounting surface 244, one support 250 extends along a length of one side of the microelectronic component 120 or mounting surface 244 and another support 250 extends along a length of another side of the microelectronic component 120 or mounting surface 244. The substrate 240 and its supports 250 may be formed of similar materials and using similar techniques to those discussed above in connection with the support 140 of FIGS. 2-4.

In the illustrated embodiment, the two supports 250 associated with a single microelectronic component 120 may be generally parallel to one another and extend along opposite sides of the microelectronic component 120. In other embodiments, the first and second supports 250 may extend along adjacent sides of the microelectronic component 120. These supports 250 may be separate from and spaced from one another, or they may be joined to form a more continuous structure. In one embodiment (not shown), a support 250 extends along each peripheral side of each of the microelectronic components 120, essentially bounding all four sides of the mounting surface 244 for each microelectronic component 120. In one particular implementation, these supports are joined to form a peripheral wall-like structure that completely encloses the mounting surface 244.

Figure 7:
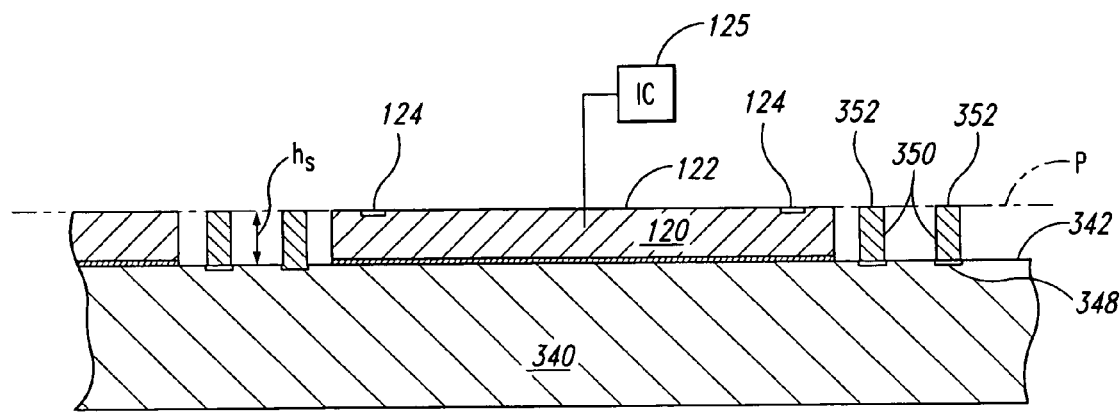
FIG. 7 is a schematic cross-sectional view of a microelectronic component assembly in accordance with an additional embodiment of the invention.

FIG. 7 illustrates another embodiment of the invention. Again, aspects of this design may be similar to aspects of the microelectronic component assembly 100 of FIGS. 2-4 and like reference numbers are used to identify analogous structures in both embodiments. The microelectronic component assembly 300 of FIG. 7 includes a microelectronic component 120 mounted to a mounting surface (not separately illustrated) of the substrate 340.

In FIGS. 2-6, the supports 150 and 250 may be formed integrally with, and be a part of, the substrate 140. The bond pads 152 carried by these supports 150 typically are formed of a different material than the bulk of the support 150. In FIG. 7, the support 350 and the bond pad surface 352 are integrally formed. In particular, the support comprises a pillar 350 of conductive material, e.g., a metal, carried on a contact 348 of the substrate. The entire pillar 350 may function as a bond pad and the bond wire (not shown) may be connected directly to the outer surface 352 of the pillar 350. The contact 348 is coupled to the circuit 345 of the substrate 340, thereby connecting the bond wire to the circuit 345. The pillars may be formed in a variety of ways, e.g., by applying a metal layer having the desired thickness and using conventional photomask and etch techniques to define the supports 350.

Figure 8:
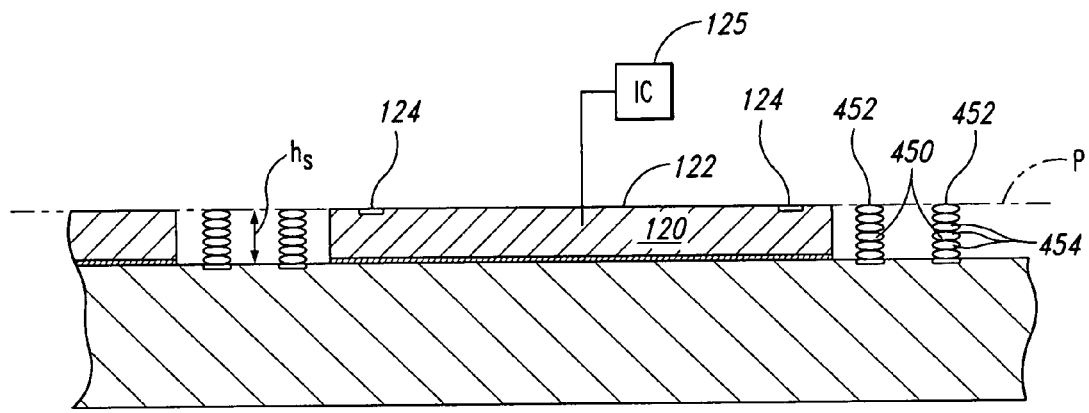
FIG. 8 is a schematic cross-sectional view of a microelectronic component assembly in accordance with one more embodiment of the invention.

FIG. 8 schematically illustrates a microelectronic component assembly 400 in still another embodiment of the invention. Like reference numbers are used in FIGS. 7 and 8 to indicate analogous structures. One difference between the microelectronic component assemblies 300 and 400 lies in the structure of the supports 350 and 450. In contract to the substantially integrally formed support 350 of FIG. 7, the support 450 of FIG. 8 comprises a number of separate conductive elements 354 stacked atop one another. In one design, these conductive elements 354 comprise so-called "stud bumps" formed by forming a molten ball at the end of a bonding wire and pressing the bonding wire against a surface, much as discussed above. Instead of spooling out a length of wire and bonding the opposite end to a microelectronic component terminal 124, the wire is cut off adjacent the now-squashed metal ball. (This technique of forming a stud bump is known in the art.) A series of these bumps may be stacked atop one another relatively quickly by the capillary C to build a support 450 of the desired height.

The outer surface of the outer conductive element 454 provides a bond pad surface 452 to which a bond wire may be bonded. This bond pad surface 452 may be substantially coplanar with the plane P of the microelectronic component terminal surface 122. Achieving precise alignment of the bond pad surface 452 and the plane P is not necessary. In one embodiment, any difference in alignment between the bond pad surface and the plane P is no greater than the average thickness of two conductive element 454, and preferably no greater than the average thickness of one conductive element 454.

Figure 9:
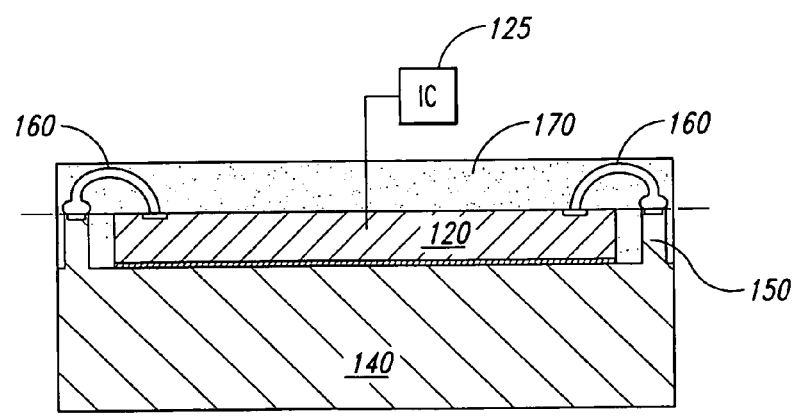
FIG. 9 is a schematic cross-sectional view of a packaged microelectronic component assembly incorporating the microelectronic component assembly of FIGS. 2-4.

FIG. 9 schematically illustrates the microelectronic component assembly 100 of FIGS. 2-4 incorporated in a packaged microelectronic component 105. In addition to the microelectronic component assembly 100, this packaged component 105 includes a dielectric matrix 170 that covers at least the bond wires 160 and the bond pad surfaces (152 in FIGS. 3 and 4) of the supports 150. In the illustrated embodiment, the dielectric matrix 170 also covers and substantially encapsulates the front surface 142 of the substrate 140 and the microelectronic component 120.

The dielectric matrix 170 may be formed of any material that will provide suitable protection for the elements within the matrix 170. It is anticipated that most conventional, commercially available microelectronic packaging encapsulants may be useful as the dielectric matrix 170. Such encapsulants typically comprise a dielectric thermosetting plastic that can be heated to flow under pressure into a mold cavity of a transfer mold. In other embodiments, the dielectric matrix 170 may comprise a more flowable dielectric resin that can be applied by wicking under capillary action instead of delivered under pressure in a transfer mold.

C. Methods of Manufacturing Microelectronic Component Assemblies

As noted above, other embodiments of the invention provide methods of manufacturing microelectronic component assemblies. In the following discussion, reference is made to the particular microelectronic component assembly 100 shown in FIGS. 2-4. It should be understood, though, that reference to this particular microelectronic component assembly is solely for purposes of illustration and that the method outlined below is not limited to any particular microelectronic component assembly shown in the drawings or discussed in detail above.

One method of the invention includes juxtaposing the confronting surface 126 of a microelectronic component 120 with a mounting surface 144 of the substrate 140. In so doing, the microelectronic component 120 is positioned between two of the supports 150 carried by the substrate. The confronting surface 126 may be attached to the mounting surface 144 in any desired fashion, e.g., using a die attach paste 135 or a die attach tape.

When so mounted, the terminal surface 122 of the microelectronic component 120 is spaced outwardly from the mounting surface 144. The plane P of the terminal surface 122 is desirably proximate the location of each of the bond pads 152 of the supports 150; in one embodiment, the surfaces of the bond pads 152 are substantially coplanar with this plane P.

A bond wire 160 may be used to couple at least one of the terminals 124 of the microelectronic component 120 to at least one of the bond pads 152. In the illustrated embodiment, a separate bond wire couples each of the terminals 124 to a different one of the bond pads 152. To form the microelectronic component package 105 of FIG. 9, the dielectric matrix 170 may be applied to the microelectronic component assembly 100. If a number of microelectronic component assemblies 100 are formed at the same time (as illustrated in FIG. 2), the matrix 170 may be applied to the front surface 142 of substrate 140 prior to dicing the substrate to produce separate packages 105.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments. In general, the terms used in the following claims should not be construed to limit the invention to the specific embodiments disclosed in the specification, unless the above-detailed description explicitly defines such terms.

The invention claimed is:

1. A method of manufacturing a microelectronic component, the method comprising:
    providing a substrate having a circuit, a front surface, and a mounting surface at the front surface, the mounting surface including a periphery sized to support a microelectronic component having a known thickness to position a terminal surface of the microelectronic component at a known height outwardly from the mounting surface;
    forming a first support at a first side of the mounting surface periphery, the first support having a first bond pad surface electrically coupled to the circuit and spaced outwardly from the mounting surface a height proximate to the known height; and
    forming a second support at a location spaced apart from the first support and proximate to a second side of the mounting surface periphery, the second support having a second bond pad surface electrically coupled to the circuit spaced outwardly from the mounting surface a height proximate to the known height.

2. The method of claim 1 wherein:
    forming a first support comprises forming the first bond pad surface approximately coplanar with a plane spaced outwardly from the terminal surface of the microelectronic component; and
    forming a second support comprises forming the second bond pad surface approximately coplanar with the plane.

3. The method of claim 1 wherein:
    forming a first support comprises forming the first bond pad surface spaced outwardly from the mounting surface a first distance; and
    forming a second support comprises forming the second bond pad surface spaced outwardly from the mounting surface a second distance that is approximately equal to the first distance.

4. The method of claim 1 wherein:
    forming a first support comprises integrally forming the first bond pad surface with the first support; and
    forming a second support comprises integrally forming the second bond pad surface with the second support.

5. The method of claim 1 wherein:
    forming a first support comprises integrally forming the first support with the substrate; and
    forming a second support comprises integrally forming the second support with the substrate.

6. The method of claim 1 wherein:
    forming a first support comprises forming the first support spaced less than about 0.4 mm from the first side of the mounting surface periphery; and
    forming a second support comprises forming the second support spaced less than about 0.4 mm from the second side of the mounting surface periphery.

7. The method of claim 1 wherein:
    forming a first support comprises forming the first support spaced no more than about 0.05 mm from the first side of the mounting surface periphery; and
    forming a second support comprises forming the second support spaced no more than about 0.05 mm from the second side of the mounting surface periphery.

8. The method of claim 1 wherein:
    forming a first support comprises forming a first pillar; and
    forming a second support comprises forming a second pillar.

9. The method of claim 1 wherein:
    forming a first support comprises forming a first support having a generally rectilinear cross-sectional shape; and
    forming a second support comprises forming a second support having a generally rectilinear cross-sectional shape.

10. The method of claim 1 wherein:
    forming a first support comprises forming a first elongate member extending along a length of the first side of the mounting surface periphery; and
    forming a second support comprises forming a second elongate member extending generally parallel to the first elongate member along a length of the second side of the mounting surface periphery.

11. The method of claim 1 wherein the substrate includes a first terminal at the first side of the mounting surface periphery and a second terminal at the second side of the mounting surface periphery, the first and second terminals being electrically coupled to the circuit, and wherein:
    forming a first support comprises placing two or more first stud bumps on the first terminal in a stacked configuration; and
    forming a second support comprises placing two or more second stud bumps on the second terminal in a stacked configuration.

12. The method of claim 1 wherein forming the first support and the second support comprises using photolithographic and etching techniques to form the first support and the second support.

13. A method of fabricating a microelectronic component subassembly, the method comprising:
- depositing a photoactive layer onto the front side of a substrate having a front side, a plurality of bond pads at the front side, integrated circuitry electrically coupled to the bond-pads, and a mounting surface sized to support a microelectronic component with a terminal surface spaced apart from the front side by a first distance;
- patterning the photo-active layer; and
- selectively developing the photo-active layer to form a plurality of supports on the front side of the substrate and aligned with the bond pads, the individual supports having a bond pad surface spaced outwardly from the front side of the substrate a second distance approximately equal to the first distance.

14. The method of claim 13, further comprising:
- adhesively coupling the microelectronic component to the mounting surface of the substrate; and
- electrically coupling the microelectronic component to one or more bond pads carried by the supports.

15. The method of claim 13 wherein the mounting surface including a periphery, and wherein selectively developing the photo-active layer to form a plurality of supports comprises forming the supports spaced less than about 0.4 mm from the mounting surface periphery.

16. The method of claim 13 wherein the mounting surface including a periphery, and wherein selectively developing the photo-active layer to form a plurality of supports comprises forming the supports spaced no more than about 0.05 mm from the mounting surface periphery.

17. The method of claim 13 wherein selectively developing the photo-active layer to form a plurality of supports comprises forming a plurality of supports having bond pad surfaces approximately coplanar with a plane spaced outwardly from the terminal surface.

18. The method of claim 13 wherein the mounting surface includes a periphery, and wherein selectively developing the photo-active layer to form a plurality of supports comprises forming an elongate member extending along a length of a first side of the mounting surface periphery, and wherein the elongate member carries one or more corresponding bond pads.

* * * * *

UNITED STATES PATENT AND TRADEMARK OFFICE
CERTIFICATE OF CORRECTION

PATENT NO. : 7,385,298 B2
APPLICATION NO. : 11/495160
DATED : June 10, 2008
INVENTOR(S) : Kinsman Page 1 of 1

It is certified that error appears in the above-identified patent and that said Letters Patent is hereby corrected as shown below:

In column 9, line 48, in Claim 1, delete "surface" and insert -- surface at --, therefor.

In column 9, line 54, in Claim 1, delete "surface" and insert -- surface at --, therefor.

In column 11, line 3, in Claim 13, delete "photoactive" and insert -- photo-active --, therefor.

Signed and Sealed this

Twenty-sixth Day of August, 2008

JON W. DUDAS
*Director of the United States Patent and Trademark Office*